United States Patent
Chen

(10) Patent No.: US 10,332,903 B2
(45) Date of Patent: Jun. 25, 2019

(54) MULTI-LAYER STRUCTURE AND A METHOD FOR MANUFACTURING THE SAME AND A CORRESPONDING CONTACT STRUCTURE

(71) Applicant: MACRONIX INTERNATIONAL CO., LTD., Hsinchu (TW)

(72) Inventor: Shih-Hung Chen, Hsinchu County (TW)

(73) Assignee: MACRONIX INTERNATIONAL CO., LTD., Hsinchu (TW)

(*) Notice: Subject to any disclaimer, the term of this patent is extended or adjusted under 35 U.S.C. 154(b) by 0 days.

(21) Appl. No.: 15/382,969

(22) Filed: Dec. 19, 2016

(65) Prior Publication Data
US 2018/0174955 A1 Jun. 21, 2018

(51) Int. Cl.
H01L 21/768 (2006.01)
H01L 49/02 (2006.01)
H01L 27/11582 (2017.01)
H01L 27/1157 (2017.01)
H01L 27/11575 (2017.01)

(52) U.S. Cl.
CPC .. H01L 27/11582 (2013.01); H01L 21/76805 (2013.01); H01L 21/76877 (2013.01); H01L 21/76892 (2013.01); H01L 27/1157 (2013.01); H01L 27/11575 (2013.01); H01L 28/60 (2013.01)

(58) Field of Classification Search
USPC ........................................................ 257/751
See application file for complete search history.

(56) References Cited

U.S. PATENT DOCUMENTS

| 8,237,228 | B2 | 8/2012 | Or-Bach et al. | |
|---|---|---|---|---|
| 9,048,341 | B2 | 6/2015 | Chen et al. | |
| 9,136,153 | B2 | 9/2015 | Or-Bach et al. | |
| 9,406,670 | B1 | 8/2016 | Or-Bach et al. | |
| 2004/0238214 | A1* | 12/2004 | Liu | H01L 21/4853 174/262 |
| 2009/0267135 | A1* | 10/2009 | Tanaka | H01L 27/115 257/324 |
| 2010/0207186 | A1* | 8/2010 | Higashi | H01L 27/11578 257/314 |

(Continued)

OTHER PUBLICATIONS

TIPO Office Action dated Feb. 8, 2018 in Taiwan application (No. 105143198).

(Continued)

Primary Examiner — Timor Karimy
(74) Attorney, Agent, or Firm — McClure, Qualey & Rodack, LLP

(57) ABSTRACT

A method for manufacturing a multi-layer structure is provided. The method includes following steps. First, a stack of alternate conductive layers and insulating layers is formed on a substrate, and the stack includes a multi-layer area and a contact area adjacent to the multi-layer area. Next, a plurality of first openings are formed in the contact area. Then, a conductive connecting structure is formed on the stack and into the first openings. Thereafter, the stack is patterned. The conductive connecting structure continuously extends on the contact area and into the first openings to maintain an electrical connection among the conductive layers while the stack is patterned.

6 Claims, 17 Drawing Sheets

(56) References Cited

U.S. PATENT DOCUMENTS

| | | | |
|---|---|---|---|
| 2012/0184097 A1 | 7/2012 | Chen et al. | |
| 2014/0019716 A1* | 1/2014 | Jezewski | H01L 23/53223 |
| | | | 712/32 |
| 2015/0249038 A1* | 9/2015 | Xu | H01L 23/53223 |
| | | | 257/751 |
| 2017/0271261 A1* | 9/2017 | Tsutsumi | H01L 27/11582 |

OTHER PUBLICATIONS

"Introduction to semiconductor manufacturing technology"; CMOS process flow, 1990s technology-global interconnection; pp. 597-598.

\* cited by examiner

MULTI-LAYER STRUCTURE AND A METHOD FOR MANUFACTURING THE SAME AND A CORRESPONDING CONTACT STRUCTURE

BACKGROUND

Technical Field

The disclosure relates to a multi-layer structure and a method for manufacturing the multi-layer structure and a corresponding contact structure, and more particularly to a method for forming a conductive connecting structure on a stack and in a plurality of first openings of the multi-layer structure.

Description of the Related Art

Recently, there is a rising demand for manufacturing multi-layer structures, such as a multi-layer structure formed of insulating layers and conductive layers, and the multi-layer structures can be applied to a memory device, a capacitor . . . etc.

However, during the process of manufacturing the multi-layer structure, an etching process may result in collecting charges and a potential difference. If the potential difference exceeds a threshold, it may discharge and cause a dielectric damage. That is, it is easy to induce arching. Even if the dielectric is not damaged, the resulted potential difference may affect the performing of the etching process, and it may have adverse effects on the forming of the multi-layer structure.

As such, it is relevant to improve the methods for manufacturing the multi-layer structure and providing a multi-layer structure having a superior performance and high reliability.

SUMMARY

In this disclosure, a multi-layer structure and a method for manufacturing the multi-layer structure is provided in order to solve at least some of the problems described above.

According to one embodiment, a method for manufacturing a multi-layer structure includes following steps. First, a stack of alternate conductive layers and insulating layers is formed on a substrate, and the stack includes a multi-layer area and a contact area adjacent to the multi-layer area. Next, a plurality of first openings are formed in the contact area. Then, a conductive connecting structure is formed on the stack and into the first openings. Thereafter, the stack is patterned. The conductive connecting structure continuously extends on the contact area and into the first openings to maintain an electrical connection among the conductive layers while the stack is patterned.

According to one embodiment, a multi-layer structure is provided. The multi-layer structure includes a substrate on a stack of alternate conductive layers and insulating layers, and includes a plurality of conductive connecting structures. The substrate includes a stack area corresponding to the stack and an extension area adjacent to the stack area. The conductive connecting structures are disposed in the extension area, wherein the conductive connecting structures extend from a top surface of the stack into the substrate, and the conductive connecting structures have different depths.

According to one embodiment, a contact structure for electrically contacting with a conductive layer disposed on a substrate is provided. The contact structure includes a body portion and a head portion. The body portion has a bottom portion electrically contacting with the conductive layer. The body portion has an inner layer and an outer layer surrounding the inner layer. The head portion laterally extends outwards from a top surface of the body portion, wherein the head portion includes the inner layer and the outer layer. The inner layer of the body portion directly contacts with the inner layer of the head portion. A lateral surface of the inner layer of the head portion directly connects to a lateral surface of the outer layer of the body portion.

BRIEF DESCRIPTION OF THE DRAWINGS

The above objects and advantages of the present invention will become more readily apparent to those ordinarily skilled in the art after reviewing the following detailed description and accompanying drawings, in which:

FIG. 1B, FIG. 2B, FIG. 3B, FIG. 4B, FIG. 40, FIG. 5B, FIG. 50, FIG. 6B, FIG. 7B and FIG. 70 are cross-section views illustrating a method for manufacturing a multi-layer structure according to one embodiment of the present disclosure.

Figure 1A:
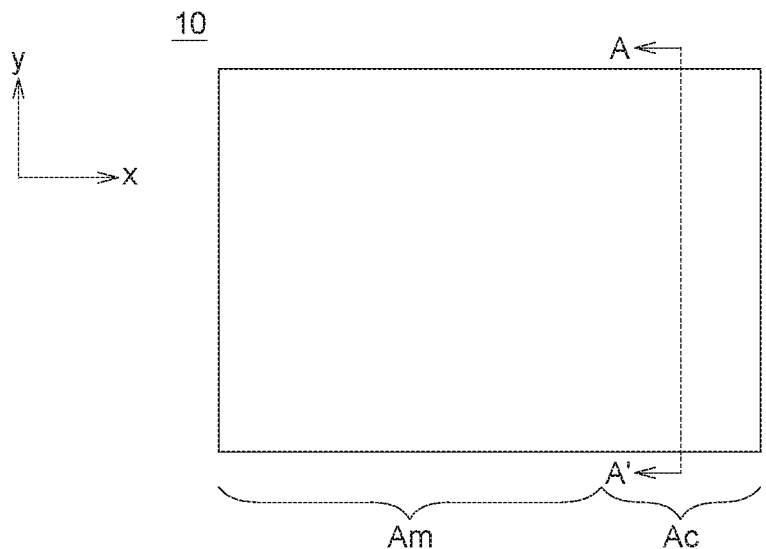
FIG. 1A, FIG. 2A, FIG. 3A, FIG. 4A, FIG. 5A, FIG. 6A and FIG. 7A are top views illustrating a method for manufacturing a multi-layer structure according to one embodiment of the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

FIG. 1A to FIG. 70 illustrate a method for manufacturing a multi-layer structure 10 according to one embodiment of the present disclosure. FIG. 1A, FIG. 2A, FIG. 3A, FIG. 4A, FIG. 5A, FIG. 6A and FIG. 7A are top views illustrating a method for manufacturing a multi-layer structure 10 according to one embodiment of the present disclosure, and illustrate a plane formed of a x-axis and a y-axis. FIG. 1B, FIG. 2B, FIG. 3B, FIG. 4B, FIG. 40, FIG. 5B, FIG. 50, FIG. 6B, FIG. 7B and FIG. 7C are cross-section views illustrating a method for manufacturing a multi-layer structure 10 according to one embodiment of the present disclosure, and illustrate a plane formed of a y-axis and a z-axis. The x-axis, the y-axis and the z-axis are perpendicular to each other.

Figure 1B:
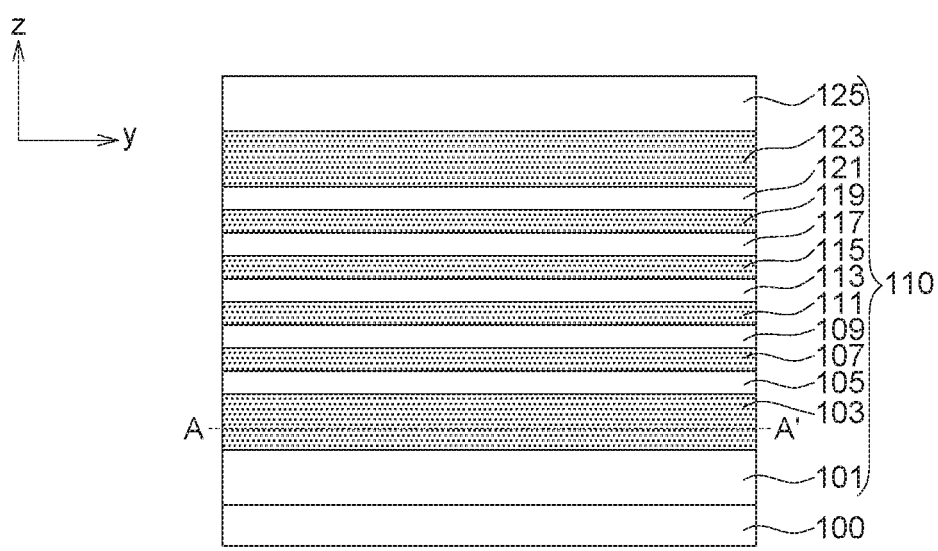

FIG. 1B is a cross-section view taken along A-A of FIG. 1A. FIG. 2B is a cross-section view taken along A-A' of FIG.

Figure 4A:
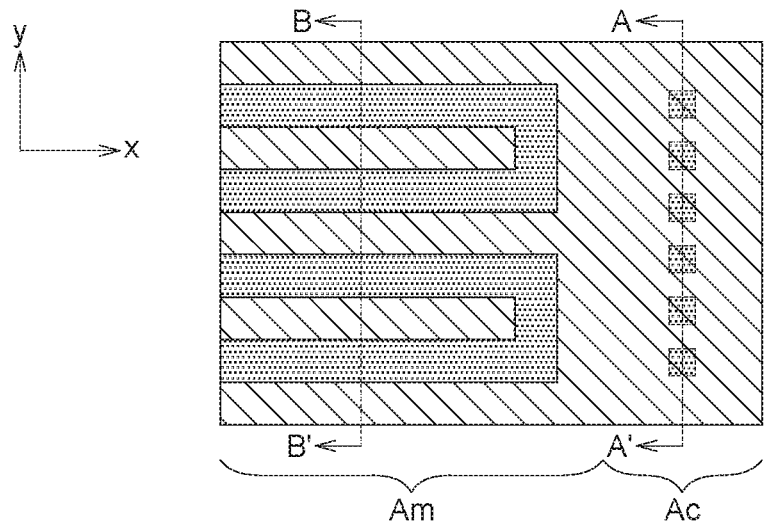
Figure 4B:
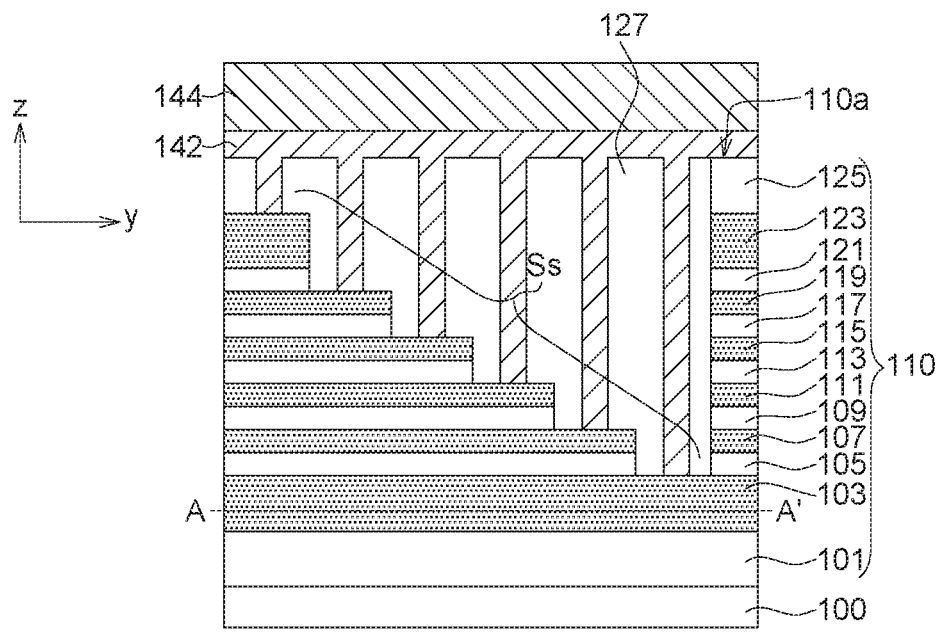
Figure 4C:
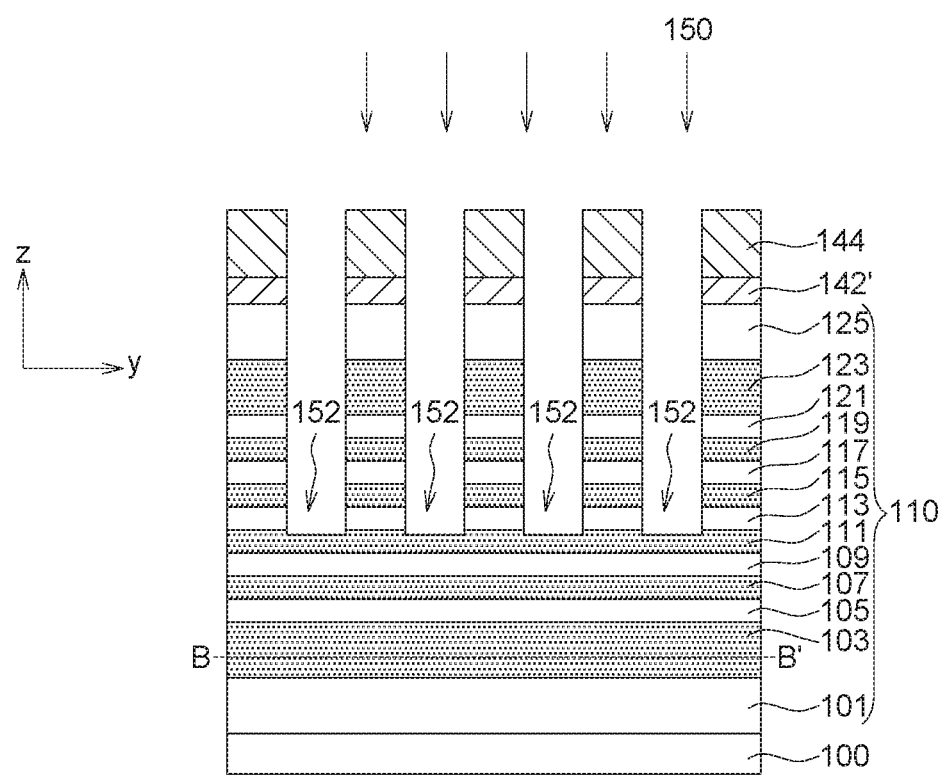
Figure 5A:
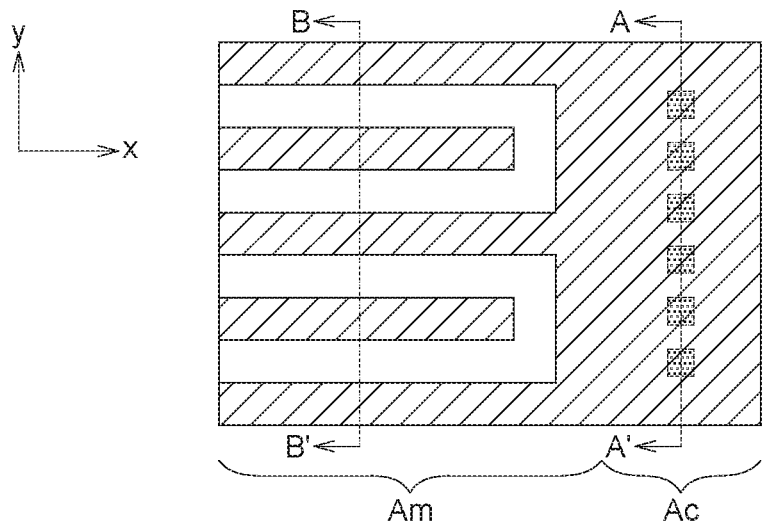
Figure 5B:
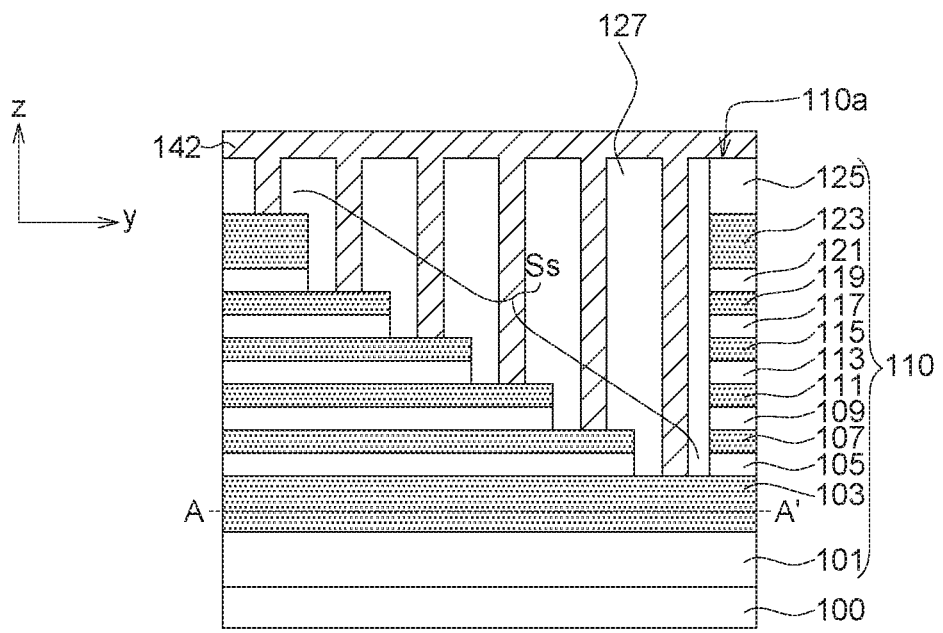
Figure 5C:
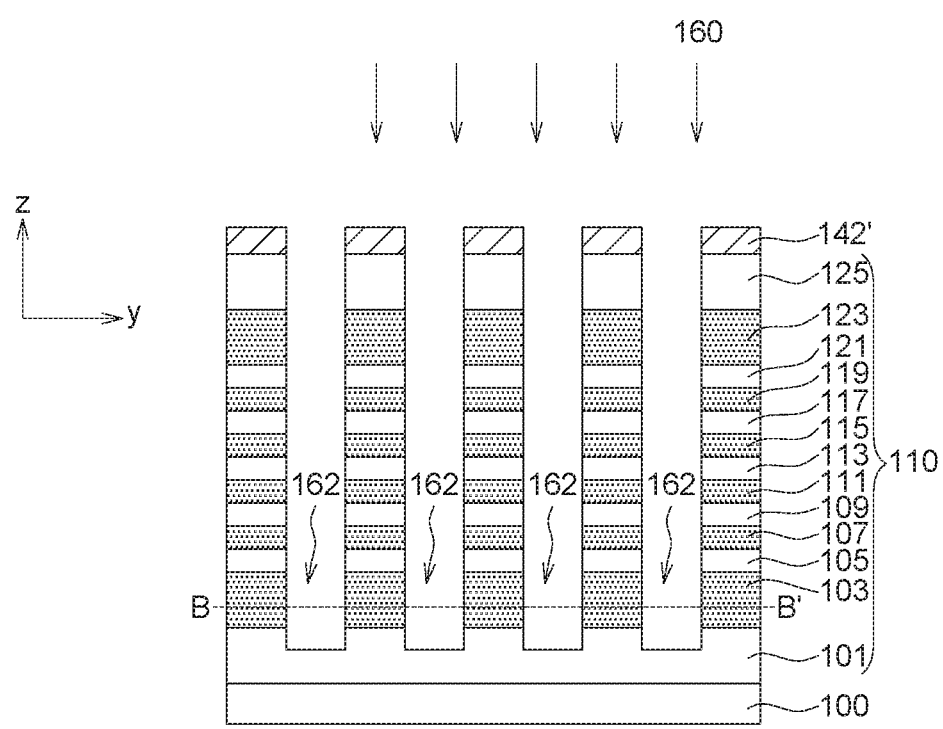

2A. FIG. 3B is a cross-section view taken along A-A' of FIG. 3A. FIG. 4B is a cross-section view taken along A-A' of FIG. 4A. FIG. 4O is a cross-section view taken along B-B' of FIG. 4A. FIG. 5B is a cross-section view taken along A-A' of FIG. 5A. FIG. 5O is a cross-section view taken along B-B' of FIG. 5A. FIG. 6B is a cross-section view taken along A-A' of FIG. 6A. FIG. 7B is a cross-section view taken along A-A' of FIG. 7A. FIG. 7O is a cross-section view taken along B-B' of FIG. 7A.

Referring to FIGS. 1A and 1B, a substrate 100 is provided. A stack 110 of alternate insulating layers 101, 105, 109, 113, 117, 121, 125 and conductive layers 103, 107, 111, 115, 119, 123 is formed on the substrate 100. In one embodiment, both of the top layer and the bottom layer of the stack 110 are insulating layers 101 and 125. The stack 110 includes a multi-layer area Am and a contact area Ac adjacent to the multi-layer area Am.

The substrate 100 may be a silicon substrate. The insulating layers 101, 105, 109, 113, 117, 121, 125 may be formed of an oxide, such as silicon dioxide ($SiO_2$). In one embodiment, the conductive layers 103, 107, 111, 115, 119, 123 may be formed of a conductive semiconductor material, such as p-type doped poly-silicon, doped with boron. In one embodiment, the conductive layers 103, 107, 111, 115, 119, 123 may be formed of a metal, such as Tungsten (W) and Titanium nitride (TIN).

Figure 2A:
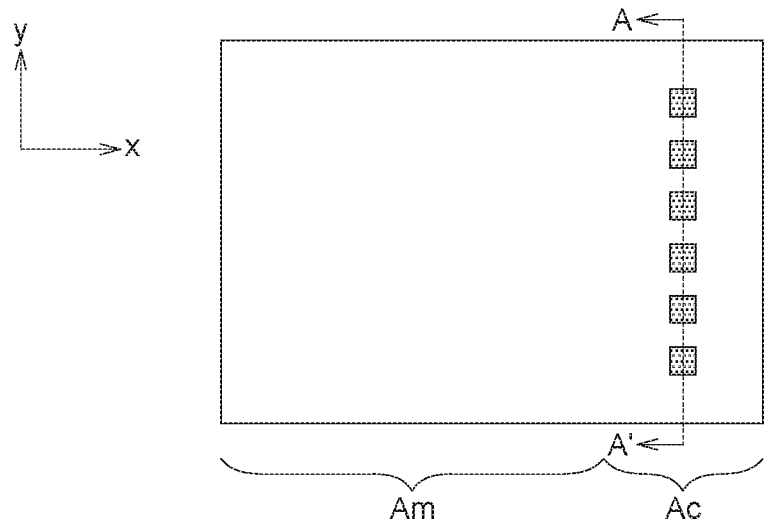
Figure 2B:
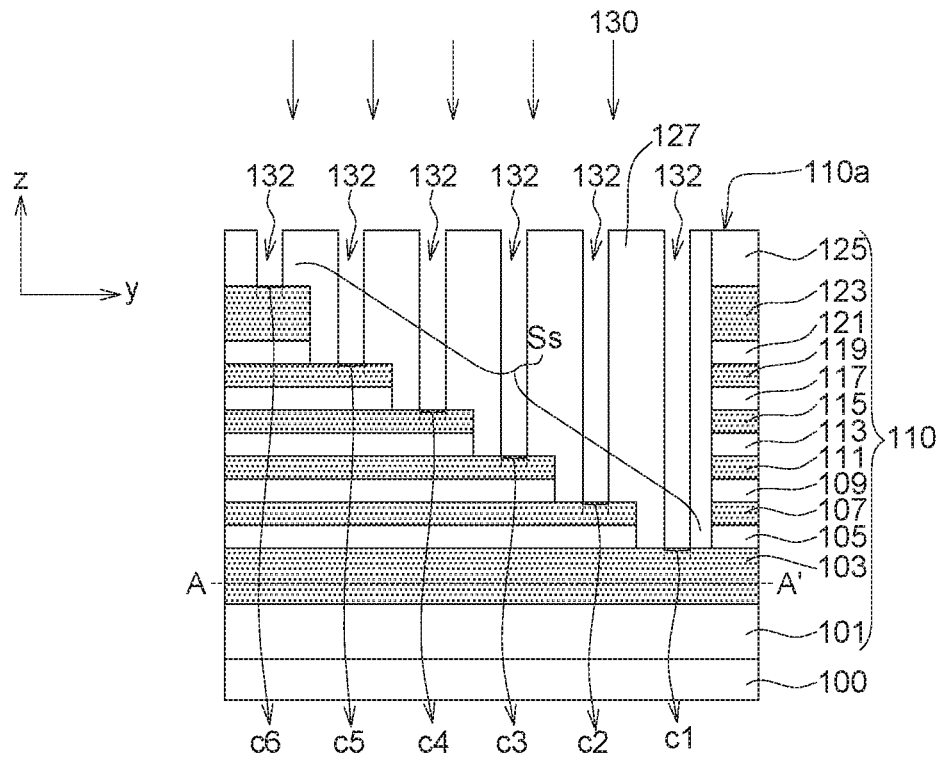

Referring to FIG. 2A and FIG. 2B, the conductive layers 103, 107, 111, 115, 119, 123 in the contact area Ac are patterned to form a first staircase structure Ss, and a insulating material 127 is filled on the first staircase structure Ss. Then, a plurality of first opening 132 penetrating through the insulating material 127 are formed in the contact area Ac. The first opening 132 have different depths from each other. The depths of the first opening 132 correspond to the conductive layers 103, 107, 111, 115, 119, 123 of the first staircase structure Ss. For example, the depth of the first opening 132 corresponding to the conductive layer 103 is larger than the depth of the first opening 132 corresponding to the conductive layer 107. The first openings 132 penetrating through the insulating material 127 vertically extend from a top surface 110a of the stack 110 to the top the conductive layers 103, 107, 111, 115, 119, 123, to expose the landing areas c1, c2, c3, c4, c5, c6.

The insulating material 127 may has the same material with the insulating layers 101, 105, 109, 113, 117, 121, 125. The first opening 132 may formed by a first etching process 130.

Figure 3A:
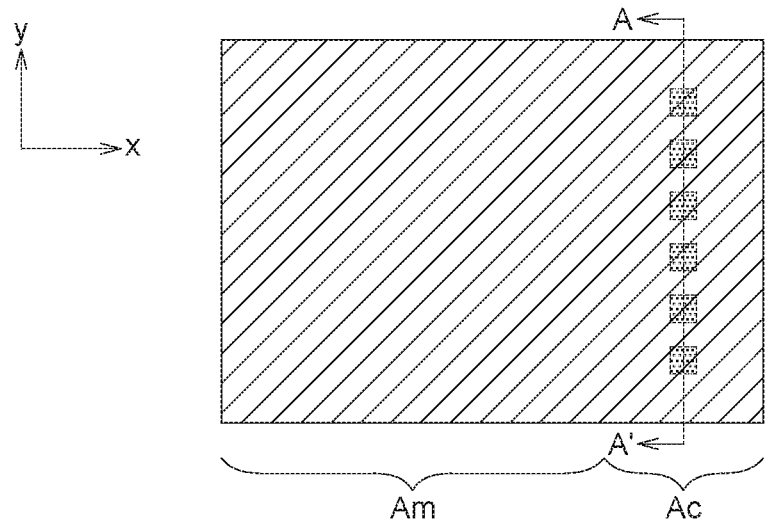
Figure 3B:
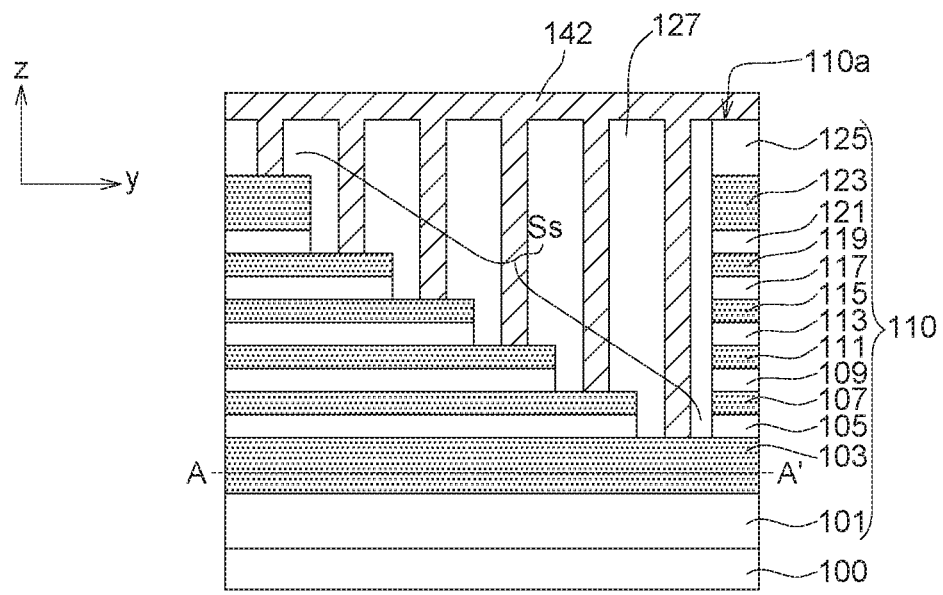

Referring to FIGS. 3A and 3B, a conductive connecting structure 142 is formed on the stack 110 and into the first openings 132. That is, the conductive connecting structure 142 covers the entire top surface 110a of the stack 110 and fills in the first openings 132, to vertically extend from the top surface 110a to the landing areas c1, c2, c3, c4, c5, c6.

In one embodiment, the conductive connecting structure 142 may be formed of a conductive semiconductor material, such as p-type doped poly-silicon, doped with boron. In one embodiment, the conductive connecting structure 142 may be formed of a metal, such as Tungsten (W) and Titanium nitride (TiN). The conductive connecting structure 142 may has the same material with the conductive layers 103, 107, 111, 115, 119, 123.

Referring to FIG. 4A, FIG. 4B, and FIG. 4O illustrating a cross-section view taken along A-A' of FIG. 4B, a photoresist layer 144 is formed on the conductive connecting structure 142. Then, the stack 110 is patterned, and in particular the multi-layer area Am is patterned. Optionally, the process of patterning the stack 110 can include a plurality of etching processes. In the embodiment, two etching processes to the multi-layer area Am are exemplarily illustrated in FIG. 4O (a second etching process 150) and FIG. 5O (a third etching process 160). However, the present disclosure is not limited thereto.

In FIG. 4O, patterning the stack 110 includes forming a plurality of second openings 152 in the multi-layer area Am by a second etching process 150. That is, a portion of the conductive layers 115, 119, 123 and insulating layers 113, 117, 121, 125 are removed by the second etching process 150, and a portion of the top of the conductive layer 111 is exposed to form the second openings 152.

In one embodiment, the second etching process 150 can include a dry etching, such as a plasma etching process.

In one embodiment, the photoresist layer 144 is used as a mask of the stack 110 and the conductive connecting structure 142. That is, during patterning the stack 110, the stack 110 and the conductive connecting structure 142 covered by the photoresist layer 144 can be protected from being removed. In FIG. 4A and FIG. 4B, the photoresist layer 144 disposed on the contact area Ac is a continuous structure. That is, the conductive connecting structure 142 disposed on the contact area Ac is covered by the photoresist layer 144 completely. Therefore, during patterning the stack 110, the conductive connecting structure 142 is completely protected by the photoresist layer 144, so that the conductive connecting structure 142 still continuously extends on the contact area Ac and into the first opening 132.

During the second etching process 150, a lot of charges may be collected on the conductive layers 103, 107, 111, 115, 119, 123, and produce a potential difference. If the conductive connecting structure 142 disposed in the contact area Ac keeps continuously extending on the contact area Ac and into the first opening 132 during patterning the stack 110, the conductive connecting structure 142 can electrically connect to the conductive layers 103, 107, 111, 115, 119, 123 in the contact area Ac, so that the conductive layers 103, 107, 111, 115, 119, 123 can be electrically connected together. That is, a short circuit is formed. Preferably, the conductive layers are grounded to exclude the charges. Therefore, the production of the potential difference among the conductive layers can be effectively avoided and the arching can be prevented, so that the conductive layers or the insulating layers can be prevented from being damaged by discharging, and the defect of the device can also be prevented. Further, since the original movement direction of the plasma may not be affected by the field produced from the collected charges during the dry etching process, the distortion of the etching pattern caused by variation of the movement direction of the plasma can be effectively avoided. Therefore, the yield of the product can be increased.

Referring to FIG. 5A, FIG. 5B and FIG. 5O, patterning the stack 110 (such as the multi-layer area Am) may include forming a plurality of third openings 162 in the second openings 152 by a third etching process 160. That is, a portion of the conductive layers 103, 107, 111 and insulating layers 101, 105, 109 are further removed by the third etching process 160, and a portion of the top surface of the insulating layers 101 can be exposed, to form the third openings 162.

As stated above, since the conductive connecting structure 142 disposed in the contact area Ac keeps continuously extending on the contact area Ac and into the first openings 132, the conductive layers 103, 107, 111, 115, 119, 123 are electrically connected together (i.e. forming a short circuit), the potential difference can be decreased and the arching can also be prevented. In other words, during pattering the stack 110, no matter during the second etching process 150 or the third etching process 160, the conductive connecting structure 142 disposed in the contact area Ac continuously extends on the contact area Ac and into the first openings 132, and an electrical connection among the conductive layers 103, 107, 111, 115, 119, 123 can be maintained. Thereafter, the photoresist layer 144 is removed. In FIG. 5D, the conductive connecting structure 142 disposed on the multi-layer area Am is patterned to be conductive connecting structures 142'.

Figure 6A:
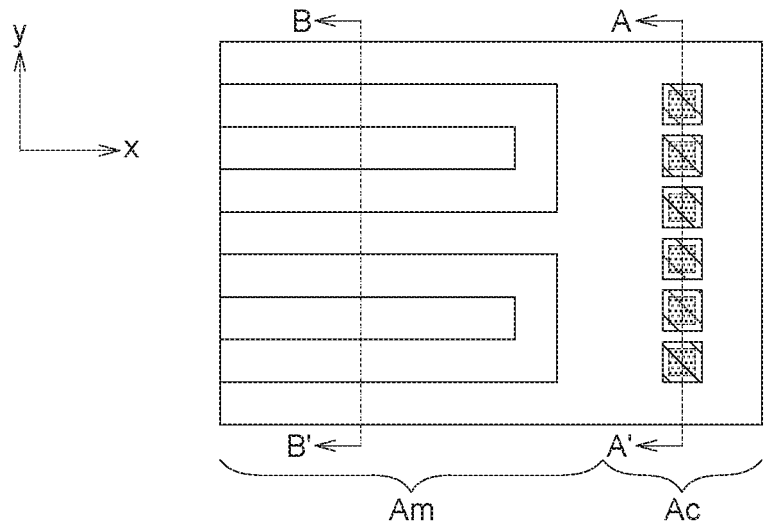
Figure 6B:
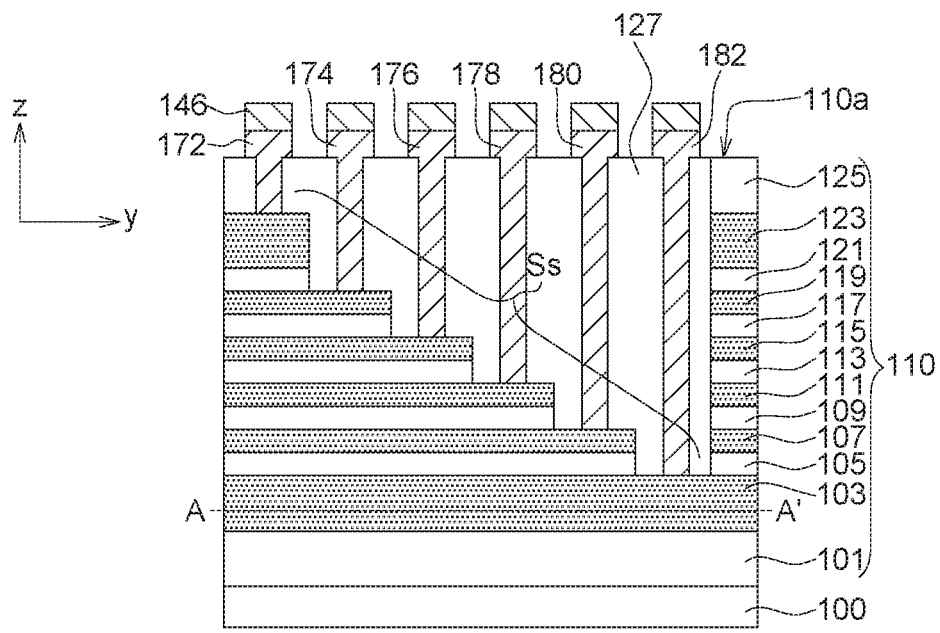
Figure 7A:
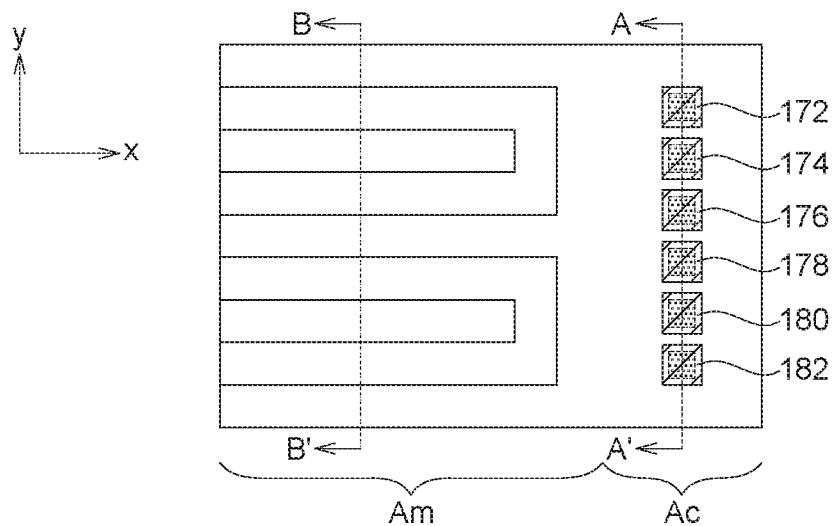
Figure 7B:
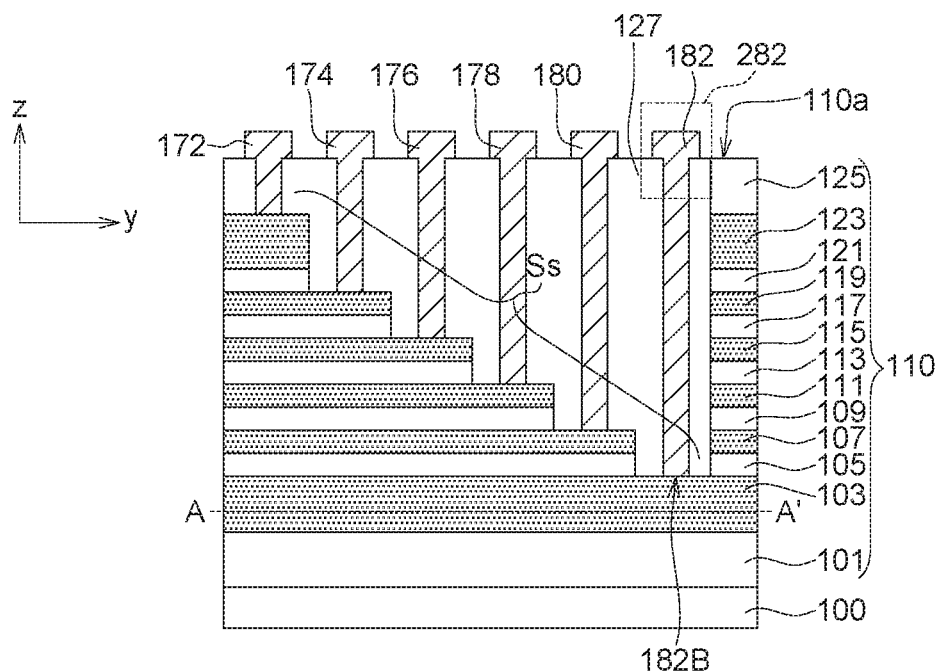

Referring to FIG. 6A and FIG. 6B, the photoresist layer 146 is formed on the conductive connecting structure 142 after the stack 110 (such as the multi-layer area Am) is patterned. Then, the conductive connecting structure 142 in the contact area Ac is patterned to form a plurality of contact structures 172, 174, 176, 178, 180, 182. In one embodiment, the contact structures 172, 174, 176, 178, 180, 182 are separated from each other.

Figure 7C:
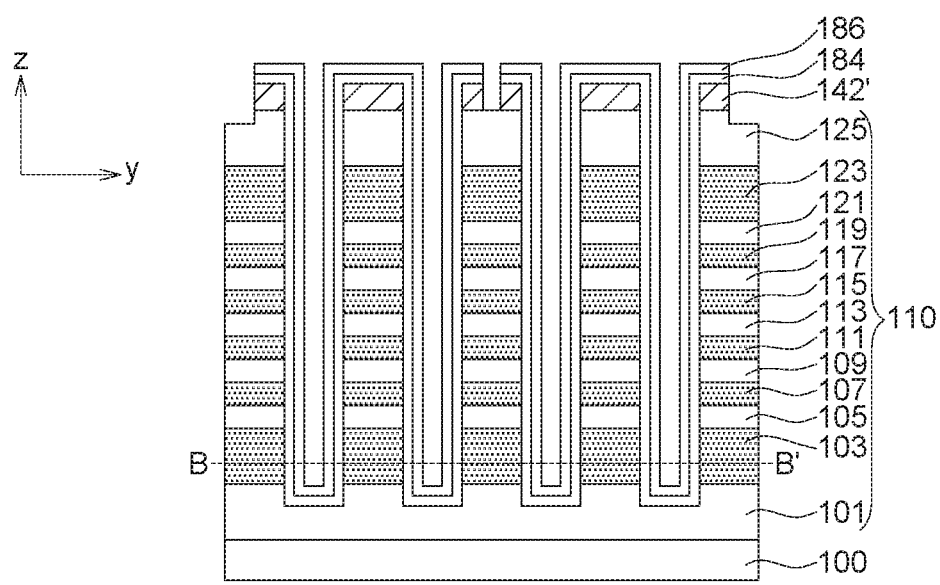

Referring to FIGS. 7A, 7B and 7C, the photoresist layer 146 is removed. In FIG. 7B, the conductive connecting structure 142 disposed in the contact area Ac is patterned to be a plurality of contact structures 172, 174, 176, 178, 180, 182. In FIG. 7O, the conductive connecting structure 142 disposed in the multi-layer area Am is patterned to be a plurality of remaining conductive connecting structure 142'. The remaining conductive connecting structure 142' has the same material with contact structures 172, 174, 176, 178, 180, 182.

In the embodiment, memory layers 184 may be formed on the sidewall of the remaining conductive connecting structure 142' and the third openings 162. Then, a semiconductor may be formed on the memory layer 184 so as to form a channel layer 186. The conductive layers 103, 107, 111, 115, 119, 123 may be used as the word lines, the ground select line or the string select lines in the multi-layer structure 10. The multi-layer structure 10 can be used as a three dimensional (3D) NAND memory. The conductive connecting structure 142 and the conductive layers 103, 107, 111, 115, 119, 123 can include the same material, such as a heavily doped polysilicon.

Figure 8A:
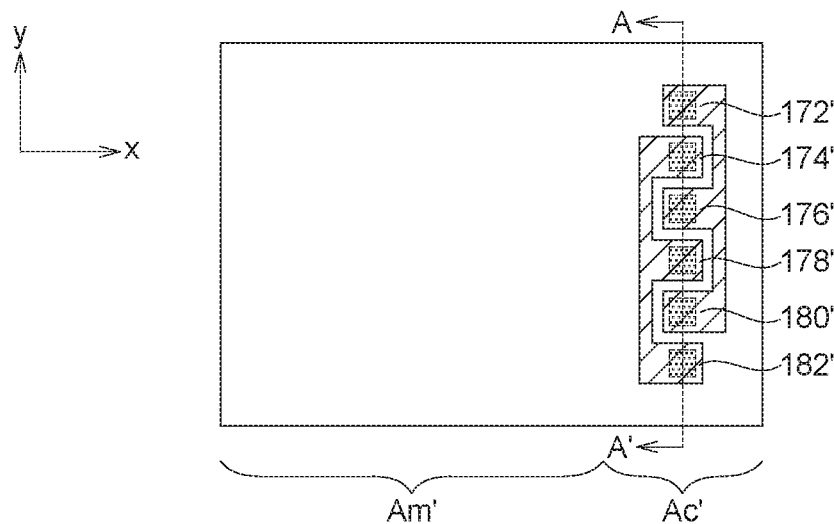
FIG. 8A is a top view illustrating a multi-layer structure according to one embodiment of the present disclosure.
Figure 8B:
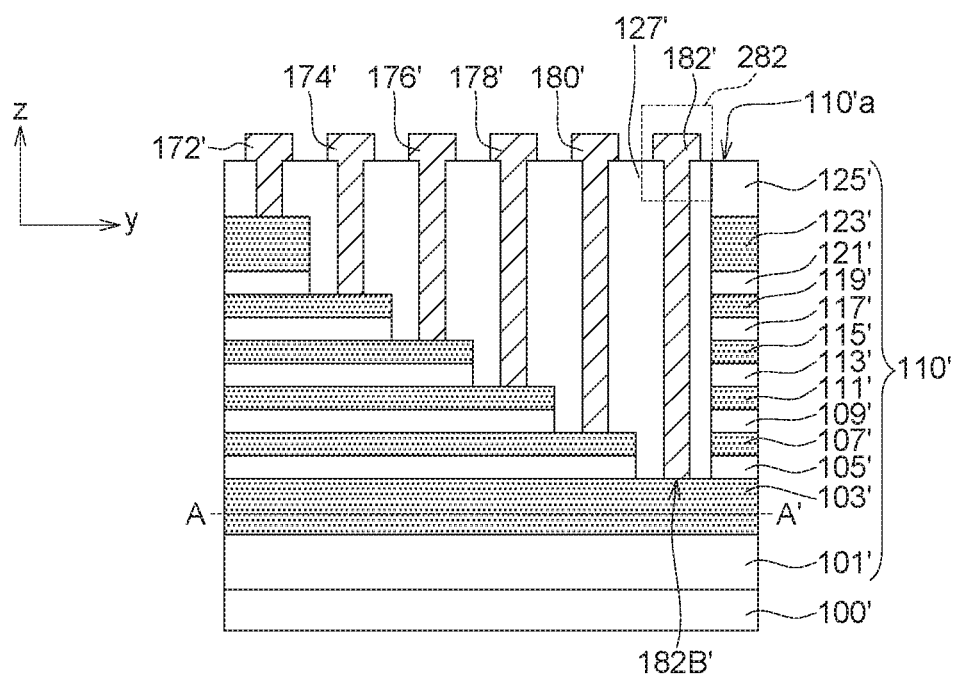
FIG. 8B is a cross-section view illustrating a multi-layer structure according to one embodiment of the present disclosure.

FIGS. 8A and 8B illustrate a multi-layer structure 20 according to one embodiment of the present disclosure. FIG. 8B illustrate a cross-section view taken along A-A' of FIG. 8A, illustrating a plane formed of a y-axis and a z-axis. The manufacturing method of the multi-layer structure 20 in FIG. 8A and FIG. 8B is similar to the manufacturing method of the multi-layer structure 10 in FIG. 1A to FIG. 6B, and the difference is in that the process of patterning the stack 110' is more simplified, such as having fewer number of etching process, and the contact structures in the contact area Ac can be electrically connected to each other.

Referring to FIGS. 8A and 8B, the contact structures 172', 176', 180' are electrically connected to each other, and the contact structures 174', 178', 182' are electrically connected to each other. The multi-layer area Am can have a plain area. In the embodiment, the multi-layer structure 20 is used as a capacitor. The material of the conductive layers 103', 107', 111', 115', 119', 123' and the contact structures 172', 174', 176', 178', 180', 182' can be Tungsten (W) and Titanium nitride (TiN). That is, the conductive layers 107', 115', 123' and the contact structures 172', 176', 180' are electrically connected to together to be an electrode, and the conductive layers 103', 111', 119' and the contact structures 174', 178', 182' are electrically connected together to be an electrode. In one embodiment, the capacitor can be applied to 2.5D IC, and be disposed on a silicon interposer.

FIG. 9 to FIG. 13 are cross-section views illustrating a method for manufacturing a multi-layer structure 30 according to another embodiment of the present disclosure, and illustrate a plane formed of the y-axis and the z-axis. The manufacturing method of the multi-layer structure 30 in FIG. 9 to FIG. 13 is similar to the manufacturing method of the multi-layer structure 10 in FIG. 1A to FIG. 6B, and the difference is in that conductive connecting structures are further formed in the substrate.

Figure 9:
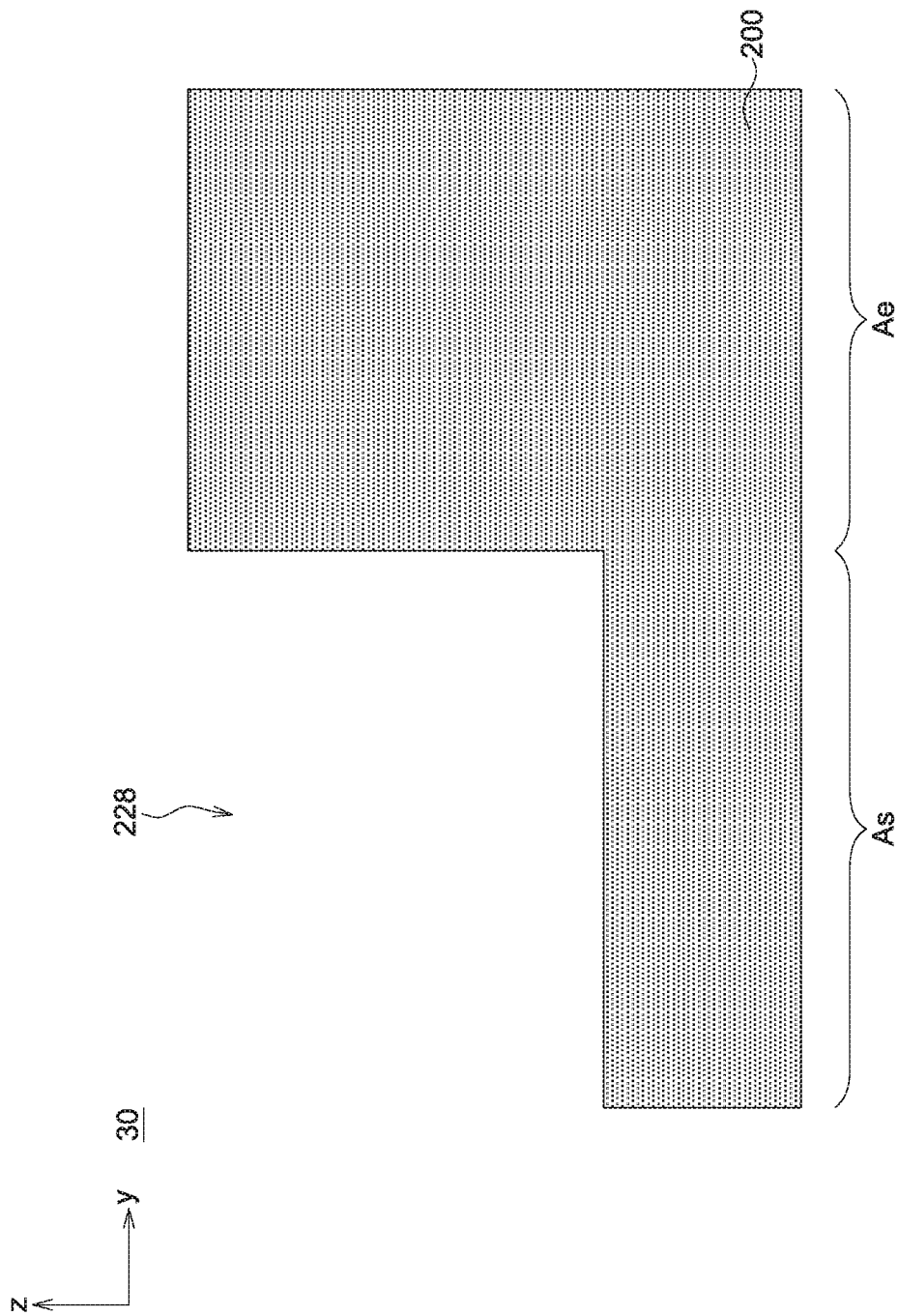
FIG. 9 to FIG. 13 are cross-section views illustrating a method for manufacturing a multi-layer structure according to another embodiment of the present disclosure.

Referring to FIG. 9, a substrate 200 includes a stack area As corresponding to a stack 210 (illustrated in FIG. 10) and an extension area Ae adjacent to the stack area As. In the embodiment, a trench 228 is formed in the substrate 200, so that a height of the stack area As is smaller than a height of the extension area Ae. However, the present disclosure is not limited thereto, and in other embodiments, the substrate can have no trenches.

Figure 10:
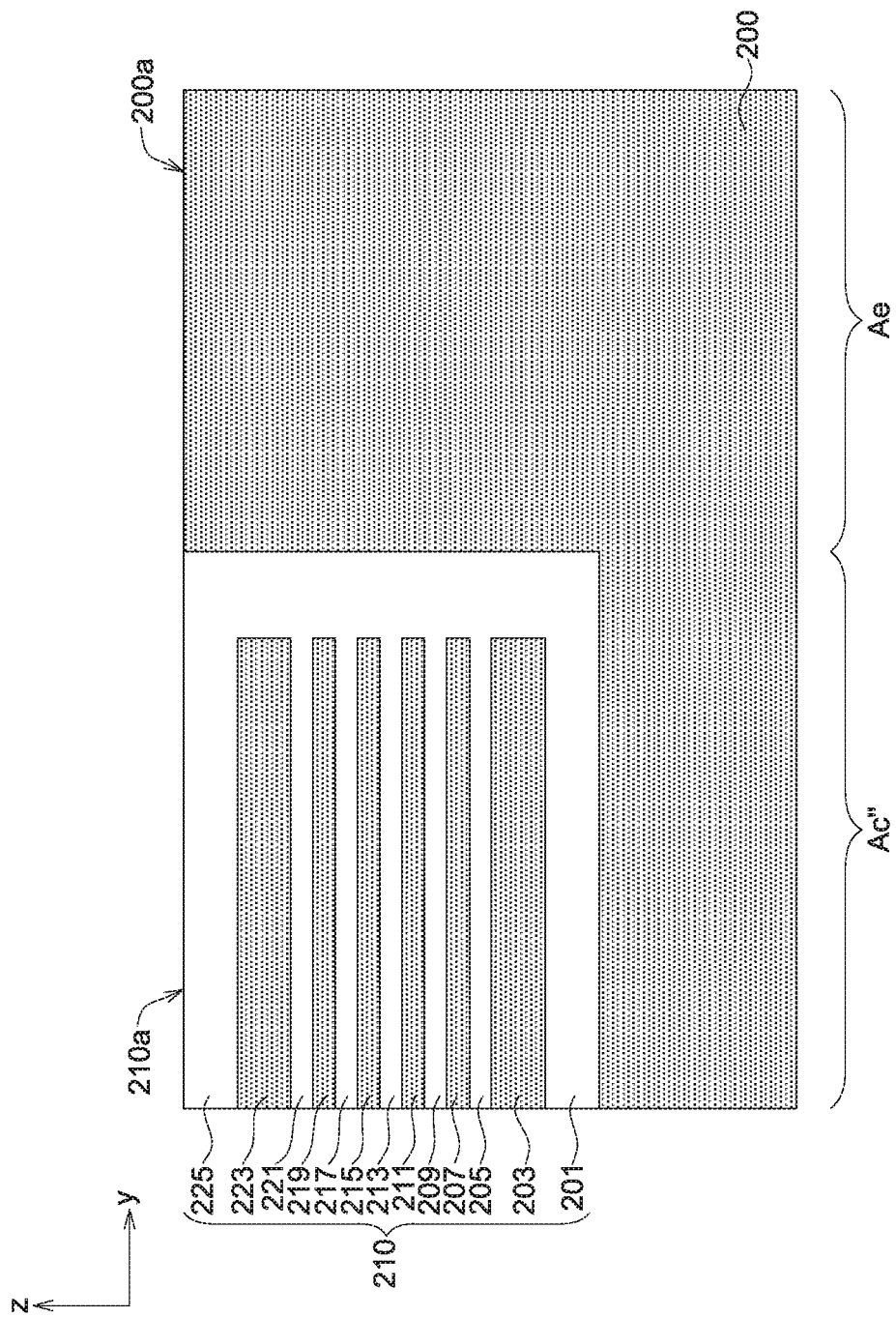

Referring to FIG. 10, the stack 210 is formed in the trench 228. The stack 210 is formed of alternate conductive layers 203, 207, 211, 215, 219, 223 and insulating layers 201, 205, 209, 213, 217, 221, 225. In one embodiment, a top surface 210a of the stack 210 is aligned with a top surface 200a of the substrate 200. The manufacturing method of the stack 210 is similar to the manufacturing method of the stack 110 in the FIG. 1A to FIG. 6B stated above. Herein, the stack 210 corresponds to the cross-section view of the stack 110 taken along A-A of FIG. 1A. That is, the stack 210 in FIG. 10 corresponds to a plane formed of the y-axis and the z-axis of the stack 110 in FIG. 1B. In the embodiment, the stack area As include multi-layer area and a contact area Ac" adjacent to the multi-layer area. FIG. 10 to FIG. 13 only illustrate the contact area Ac" in the stack area As, but the multi-layer area is not illustrated in the figures.

Figure 11:
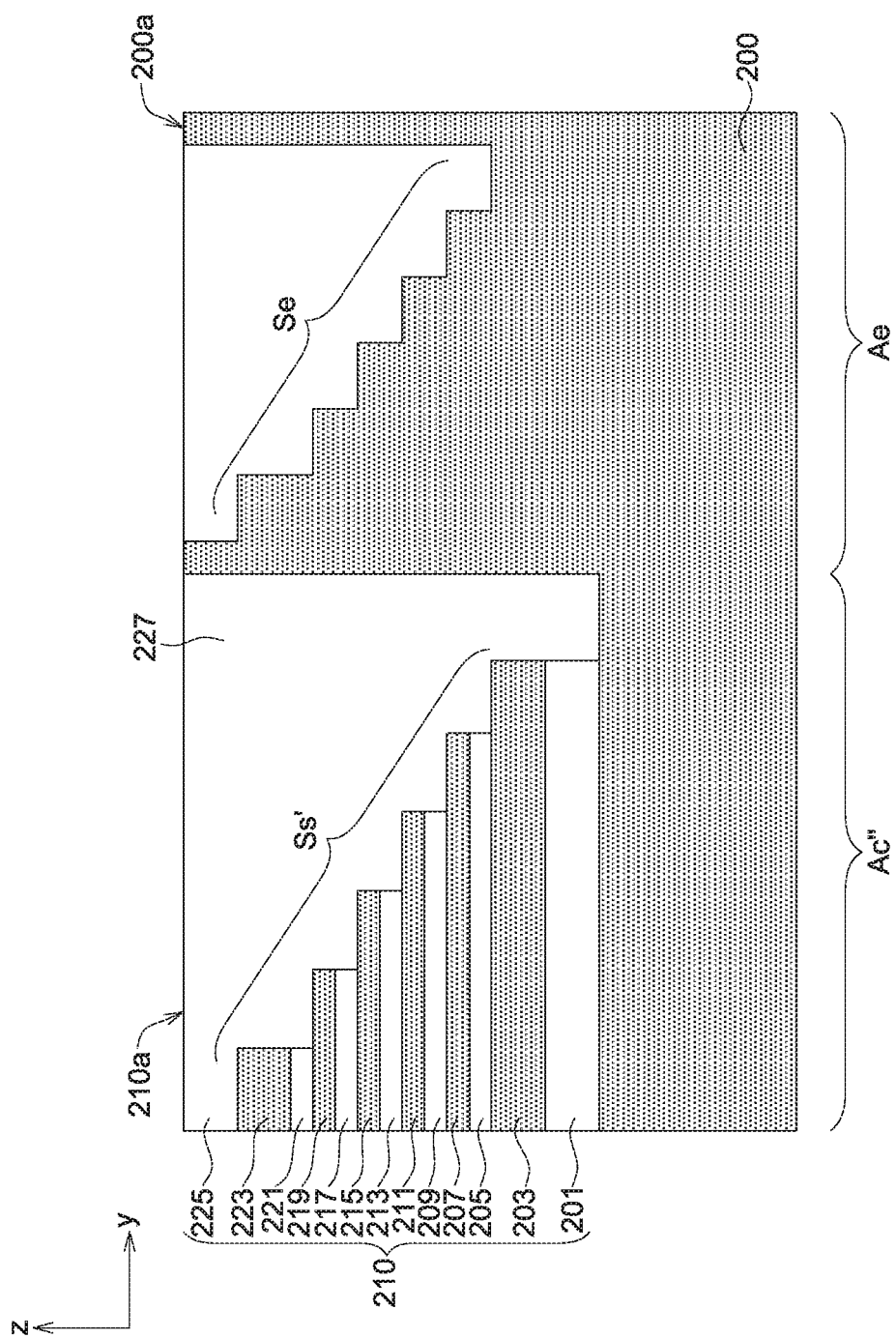

Referring to FIG. 11, the conductive layers 203, 207, 211, 215, 219, 223 in the contact area Ac" and the substrate 200 in the extension area Ae are simultaneously patterned, and a first staircase structure Ss' and a second staircase structure Se are formed respectively. That is, the lengths of the conductive layers 203, 207, 211, 215, 219, 223 in the direction of the y-axis are gradually increased toward the bottom of the substrate 200, to form the first staircase structure Ss' having 6 steps, and the lengths of the substrate 200 in the direction of the y-axis are gradually increased towards the bottom of the substrate 200 to form the second staircase structure Se having 6 steps. However, the number of steps of the first staircase structure Ss' and the second staircase structure Se are not limited to 6 steps.

Figure 12:
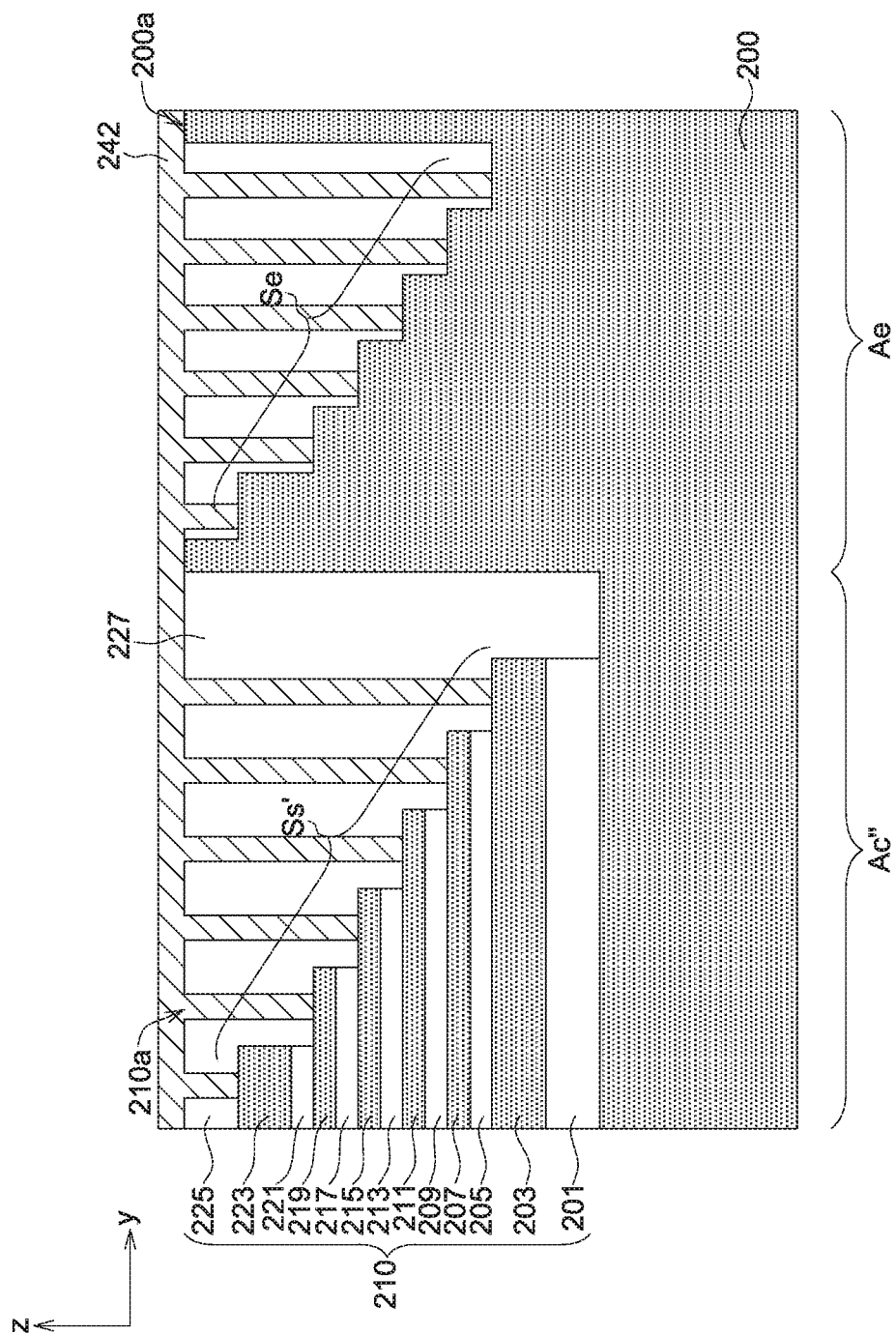

Referring to FIG. 12, a conductive connecting structure 242 is formed in the stack area As and the extension area As. That is, the stack area As including the multi-layer area (not shown) and the contact area Ac", and the extension area Ae are covered by the conductive connecting structure 242. Additionally, when a plurality of first openings (not shown) which are similar to the first openings 132 in FIG. 2B are formed in the stack 210, a plurality of outer openings (not shown) are simultaneously formed in the extension area Ae. Similar to the first openings 132, the outer openings also have different depths. The conductive connecting structure 242 continuously extends on the contact area Ac", into the first openings, on the extension area Ae and into the outer openings. That is, the conductive connecting structure 242 is continuously extends from the contact area Ac into the substrate 200.

During patterning the stack 210, the conductive connecting structure 242 keeps continuously extending on the contact area Ac", into the first openings, on the extension area Ae and into the outer openings, to electrically connect the conductive layers 203, 207, 211, 215, 219, 223 and the substrate 200. Thereby, not only all of the conductive connecting structure 242 and the conductive layers 203, 207, 211, 215, 219, 223 are electrically connected together (i.e. forming a short circuit), but the substrate 200 can also be electrically connected, and the collected charges can be more effectively guided into the substrate 200 (i.e. grounded). Therefore, in comparison with the embodiment having no conductive connecting structure 242 in the substrate, the charges collected during the etching process can be more effectively released.

Figure 13:
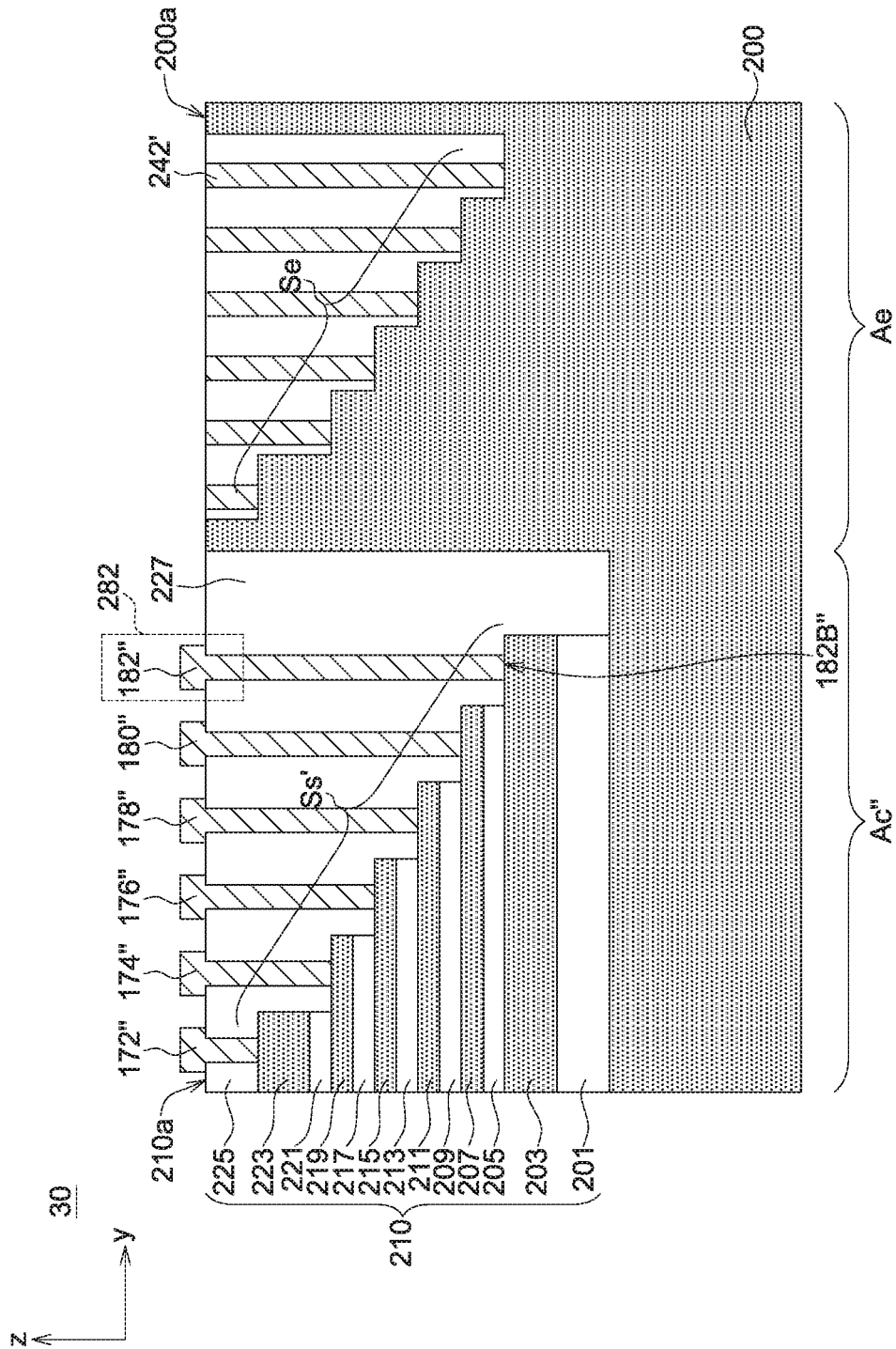

Referring to FIG. 13, the conductive connecting structure 242 is patterned, and a plurality of contact structures 172", 174", 176", 178", 180", 182" are formed in the contact area Ac", and a plurality of conductive connecting structure 242' are formed in the extension area Ae. The conductive connecting structure 242' vertically extends in the contact area Ac". A portion of the contact structures 172", 174", 176", 178", 180", 182" is higher than the top surface 200a of the substrate 200 and the top surface 210a of the stack 210. The conductive connecting structures 242' vertically extend from the top surface 200a of the substrate 200 into the extension area Ae of the substrate 200. The conductive connecting structures 242' have different depths. The conductive connecting structures 242' and the contact structures 172", 174", 176", 178", 180", 182" have the same material. Each of the conductive connecting structures 242' may have a depth larger than 1000 Angstrom. Each of the contact structures 172", 174", 176", 178", 180", 182" may have a depth larger than 1000 Angstrom. The depths of the conductive connecting structures 242' may be different from the depths of the contact structures 172", 174", 176", 178", 180", 182'. In one embodiment, the conductive connecting structures 242' formed in the substrate 200 may be a dummy structure without electrically connecting to other devices or elements. In one embodiment, the conductive connecting structures 242' may be electrically connected to other devices or elements.

Figure 14:
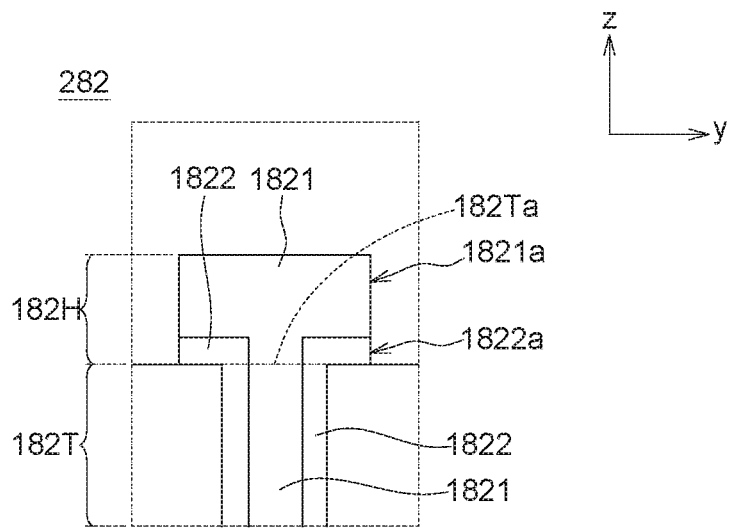
FIG. 14 is a cross-section view illustrating a contact structure according to one embodiment of the present disclosure.
Figure 15:
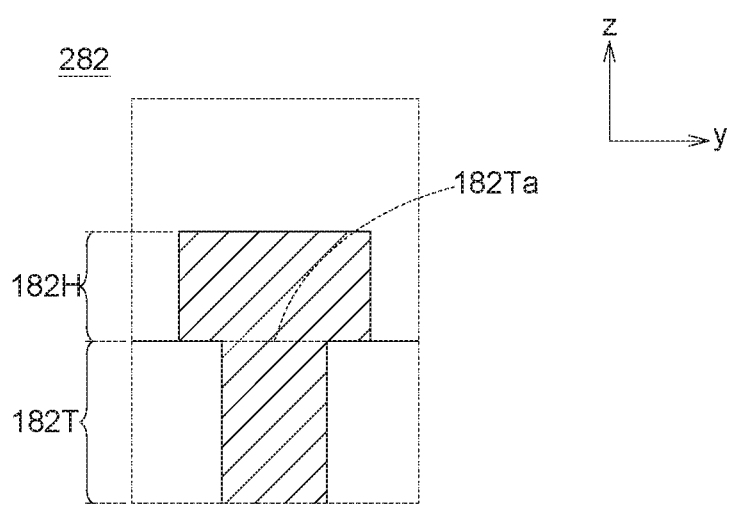
FIG. 15 is a cross-section view illustrating a contact structure according to one embodiment of the present disclosure.

FIG. 14 is a cross-section view illustrating a contact structure according to one embodiment of the present disclosure, which illustrates a plane formed of the y-axis and the z-axis. FIG. 15 is a cross-section view illustrating a contact structure according to one embodiment of the present disclosure, which illustrates a plane formed of the y-axis and the z-axis.

FIG. 14 and FIG. 15 are partial enlarge views illustrating the dotted block 282 of the contact structures 182, 182' 182" shown in FIG. 7B, FIG. 8B and FIG. 13. The contact structures 172, 172', 172", 174, 174', 174", 176, 176', 176", 178, 178', 178", 180, 180', 180", 182, 182', 182" may be formed by the same method. Herein, only the contact structures 182, 182', 182" are taken to be an example. Referring to FIG. 6B, FIG. 7B, FIG. 8B, FIG. 14 and FIG. 15, the contact structures 182, 182', 182" are electrically connected to the conductive layers 103, 103', 203 disposed on the substrate 100, 100' or 200. The contact structures 182, 182', 182" include a body portion 182T and a head portion 182H. The body portion 182T has a bottom portion 182B, 182B', 182B" and electrically contacts with the conductive layers 103, 103', 203. The head portion 182H laterally extends outwards from a top surface 182Ta of the body portion 182T. That is, a width of the head portion 182H is larger than a width of the body portion 182T.

Referring to FIG. 14, the body portion 182T has an inner layer 1821 and an outer layer 1822, and the outer layer 1822 surrounds the inner layer 1821. The head portion 182H also has the inner layer 1821 and the outer layer 1822. In the head portion 182H, the outer layer 1822 is covered by the inner layer 1811 and the outer layer 1822 surrounds a portion of the inner layer 1821. The inner layer 1821 of the body portion 182T directly contacts with the inner layer 1821 of the head portion 182H. That is, there is no outer layer 1822 between the inner layer 1821 of the body portion 182T and the inner layer 1821 of the head portion 182H.

A lateral surface 1821a of the inner layer 1821 of the head portion 182H directly connects to a lateral surface 1822a of the outer layer 1822 of the head portion 182H, and the lateral surface 1821a is aligned with the lateral surface 1822a. That is, the lateral surface 1821a of the inner layer 1821 of the head portion 182H is not covered by the outer layer 1822. During the following process, if the insulating material (not shown) is filled between the contact structures, the lateral surface 1821a of the inner layer 1821 of the head portion 182H may directly contact with the insulating material.

In one embodiment, the inner layer 1821 and the outer layer 1822 may have different material. The inner layer 1821 includes tungsten (W) and the outer layer 1822 includes titanium nitride (TiN).

Since the contact structures 172, 172', 172", 174, 174', 174", 176, 176', 176", 178, 178', 178", 180, 180', 180", 182, 182', 182" of the present disclosure is formed by directly patterning the conductive connecting structure 142 or 242, in comparison to the traditional process, for example the process which performing the Chemical Mechanical Polishing (CMP) after forming the body portion and then forming a head portion of TiN/Al/TiN, or a dual damascene process, it has more simplified manufacturing method.

Referring to FIG. 15, the difference between FIG. 15 and FIG. 14 is in that, the inner layer 1821 and the outer layer 1822 include a same material, such as a heavily doped polysilicon. In one embodiment, the body portion 182T and the head portion 182H are an integral structure formed of the heavily doped polysilicon. Since the contact structures 172, 172', 172", 174, 174', 174", 176, 176', 176", 178, 178', 178", 180, 180', 180", 182, 182', 182" is formed by filling in the conductive connecting structure 142 or 242 at one time, there is no connecting interfaces between the body portion 182T and the head portion 182H. On the contrary, the conductive layers 103, 107, 111, 115, 119, 123, 103', 107', 111', 115', 119', 123', 203, 207, 211, 215, 219, 223 and the contact structures 172, 172', 172", 174, 174', 174", 176, 176', 176", 178, 178', 178", 180, 180', 180", 182, 182', 182" are not an integral structure formed at the same time, and there may be a connecting interface (such as oxidation traces) between the bottom of the conductive layers 103, 107, 111, 115, 119, 123, 103', 107', 111', 115', 119', 123', 203, 207, 211, 215, 219, 223 and the contact structures 172, 172', 172", 174, 174', 174", 176, 176', 176", 178, 178', 178", 180, 180', 180", 182, 182', 182".

According to an embodiment of the present disclosure, a multi-layer structure and a manufacturing method of the multi-layer structure are provided. During patterning the stack 110, keeping the conductive connecting structures 142 in the contact area Ac continuously extending on the contact area Ac and into the first openings 132 makes all of the conductive connecting structure 142 and the conductive layers 103, 107, 111, 115, 119, 123 being electrically connected together (i.e. forming a short circuit), and preferably, the conductive layers are grounded to exclude the charges. Therefore, the production of the potential difference among the conductive layers can be effectively avoided and the arching can be prevented, so that the conductive layers or the insulating layers can be prevented from being damaged by discharging, and the defect of the device can also be prevented. Further, since the original movement direction of the plasma may not be affected by the field produced from the collected charges during the dry etching process, the distortion of the etching pattern caused by variation of the movement direction of the plasma can be effectively avoided. Therefore, the yield of the product can be increased. Moreover, if the conductive connecting structures 242 are further formed in the substrate 200, and the conductive connecting structures 242 in the contact area Ac" are kept continuously extending on the contact area Ac", into the first opening, on the extension area Ae and into the outer openings, all of the conductive connecting structures 242 and the conductive layers 203, 207, 213, 215, 219, 223 can be electrically connected together (i.e. forming a short circuit), and can even be electrically connected to the substrate 200. The collected charges can be more effectively guided into the substrate 200, i.e. grounded. Therefore, the multi-layer structure formed by the manufacturing method of the present disclosure stated above can prevent from the adverse effects resulted from etching, and a multi-layer structure having a superior performance and a high reliability can be formed.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A multi-layer structure, comprising:
   a silicon substrate;
   a stack of alternate conductive layers and insulating layers, wherein the silicon substrate comprises a stack area corresponding to the stack and an extension area adjacent to the stack area; and
   a plurality of conductive connecting structures disposed in the extension area, wherein the conductive connecting structures extend from a top surface of the silicon substrate into the silicon substrate, and the conductive connecting structures have different depths.

2. The multi-layer structure according to claim 1, wherein each of the conductive connecting layers in the extension area has a depth lager than 1000 angstrom.

3. The multi-layer structure according to claim 1, further comprising:
   a trench disposed in the silicon substrate, wherein the stack is formed in the trench.

4. The multi-layer structure according to claim 1, wherein the stack comprises a multi-layer area and a contact area, the conductive layers in the contact area and the silicon substrate in the extension area have a first staircase structure and a second staircase structure respectively.

5. The multi-layer structure according to claim 1, further comprising:
   a plurality of contact structures vertically extending in the contact area, wherein the contact structures and the conductive connecting structures have a same material.

6. The multi-layer structure according to claim 1, wherein a top surface of the stack is aligned with the top surface of the silicon substrate.

* * * * *